US012002756B2

(12) United States Patent
You et al.

(10) Patent No.: US 12,002,756 B2
(45) Date of Patent: Jun. 4, 2024

(54) BUTTED CONTACTS AND METHODS OF FABRICATING THE SAME IN SEMICONDUCTOR DEVICES

(71) Applicant: Taiwan Semiconductor Manufacturing Co., Ltd., Hsin-Chu (TW)

(72) Inventors: Jia-Chuan You, Taoyuan County (TW); Chia-Hao Chang, Hsinchu (TW); Tien-Lu Lin, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 19 days.

(21) Appl. No.: 17/665,941

(22) Filed: Feb. 7, 2022

(65) Prior Publication Data
US 2022/0157721 A1 May 19, 2022

Related U.S. Application Data

(62) Division of application No. 16/745,716, filed on Jan. 17, 2020, now Pat. No. 11,244,899.

(51) Int. Cl.
*H01L 23/528* (2006.01)
*H01L 21/3105* (2006.01)
(Continued)

(52) U.S. Cl.
CPC .... *H01L 23/5283* (2013.01); *H01L 21/31111* (2013.01); *H01L 21/32051* (2013.01);
(Continued)

(58) Field of Classification Search
CPC .......... H01L 21/76877; H01L 23/5221; H01L 23/5283; H01L 21/31111; H01L 21/32051; H01L 21/3212; H01L 21/76802; H01L 21/76897; H01L 29/41791; H01L 29/42372; H01L 29/6656; H01L 29/66795; H01L 29/7851; H01L 21/31053; H01L 29/66545; H01L 21/76883; H01L 29/785; H01L 21/76834; H01L 21/76895;
(Continued)

(56) References Cited

U.S. PATENT DOCUMENTS 8,772,109 B2   7/2014   Colinge
8,785,285 B2   7/2014   Tsai et al.
(Continued)

*Primary Examiner* — Farun Lu
(74) *Attorney, Agent, or Firm* — Haynes and Boone, LLP

(57) ABSTRACT

A method of forming a semiconductor structure includes first forming a metal gate (MG) over a semiconductor layer, a gate spacer on a sidewall of the MG, and a source/drain (S/D) feature disposed in the semiconductor layer and adjacent to the MG, forming an S/D contact (MD) over the S/D feature, forming a first ILD layer over the MG and the MD, and subsequently patterning the first ILD layer to form an opening. The method further includes forming a metal layer in the opening, such that the metal layer contacts both the MG and the MD, removing a top portion of the metal layer to form a trench, filling the trench with a dielectric layer, and subsequently forming a second ILD layer over the dielectric layer.

20 Claims, 19 Drawing Sheets

(51) Int. Cl.
*H01L 21/311* (2006.01)
*H01L 21/3205* (2006.01)
*H01L 21/321* (2006.01)
*H01L 21/768* (2006.01)
*H01L 23/522* (2006.01)
*H01L 29/417* (2006.01)
*H01L 29/423* (2006.01)
*H01L 29/66* (2006.01)
*H01L 29/78* (2006.01)

(52) U.S. Cl.
CPC .... *H01L 21/3212* (2013.01); *H01L 21/76802* (2013.01); *H01L 21/76877* (2013.01); *H01L 21/76897* (2013.01); *H01L 23/5221* (2013.01); *H01L 29/41791* (2013.01); *H01L 29/42372* (2013.01); *H01L 29/6656* (2013.01); *H01L 29/66795* (2013.01); *H01L 29/7851* (2013.01); *H01L 21/31053* (2013.01); *H01L 29/66545* (2013.01)

(58) Field of Classification Search
CPC ......... H01L 27/0886; H01L 21/823431; H01L 21/823475
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 2017/0141037 A1* | 5/2017 | Wu .................. H01L 21/823431 |
| 2018/0033866 A1 | 2/2018 | Liao et al. |
| 2019/0385946 A1* | 12/2019 | Xie .................... H01L 27/0886 |

* cited by examiner

BUTTED CONTACTS AND METHODS OF FABRICATING THE SAME IN SEMICONDUCTOR DEVICES

CROSS-REFERENCE TO RELATED APPLICATIONS

This is a divisional application of U.S. patent application Ser. No. 16/745,716, filed Jan. 17, 2020, and entitled "Butted Contacts and Methods of Fabricating the Same in Semiconductor Devices," the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication of butted contacts and interconnect features has become more challenging as feature sizes continue to decrease. At smaller length scales, the butted contacts and interconnect features may benefit from lengthened separation distance in an effort to remedy electrical shorting concerns and to improve device performance. Though existing methods of fabricating butted contacts and interconnect features have been generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
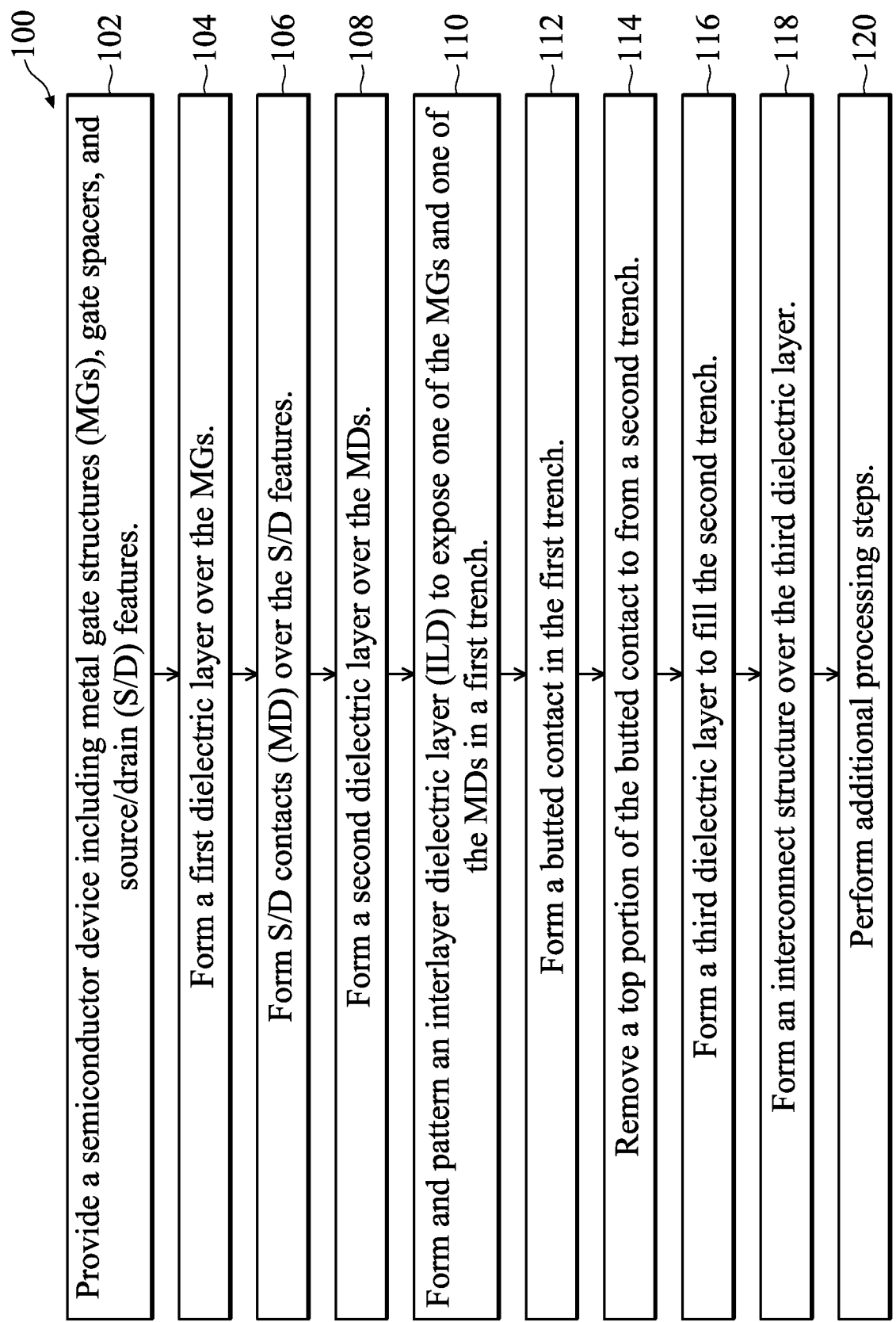
FIG. 1 shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as planar FETs, three-dimensional fin-like FETs (FinFETs), or gate-all-around (GAA) FETs. It is an objective of the present disclosure to provide vertical interconnect features (e.g., via contact features) for connecting source/drain contacts, metal gate stacks, and/or other features with additional interconnect features in semiconductor devices.

In FET fabrication, an interconnect structure such as a conductive line may be formed in close proximity to a butted contact, which electrically couples a metal gate stack (e.g., a high-k metal gate, or HKMG, structure) to a source/drain (S/D) contact. At large length scales, IC layouts may be designed to ensure that the interconnect structure is sufficiently far away from the butted contact in order to avoid potential electrical shorting between the two. However, as features sizes continue to decrease, accommodating such separation becomes challenging. The present disclosure provides methods of reducing the separation distance between an interconnect structure and a butted contact to alleviate concerns for electrical shorting within the device.

Figure 2A:
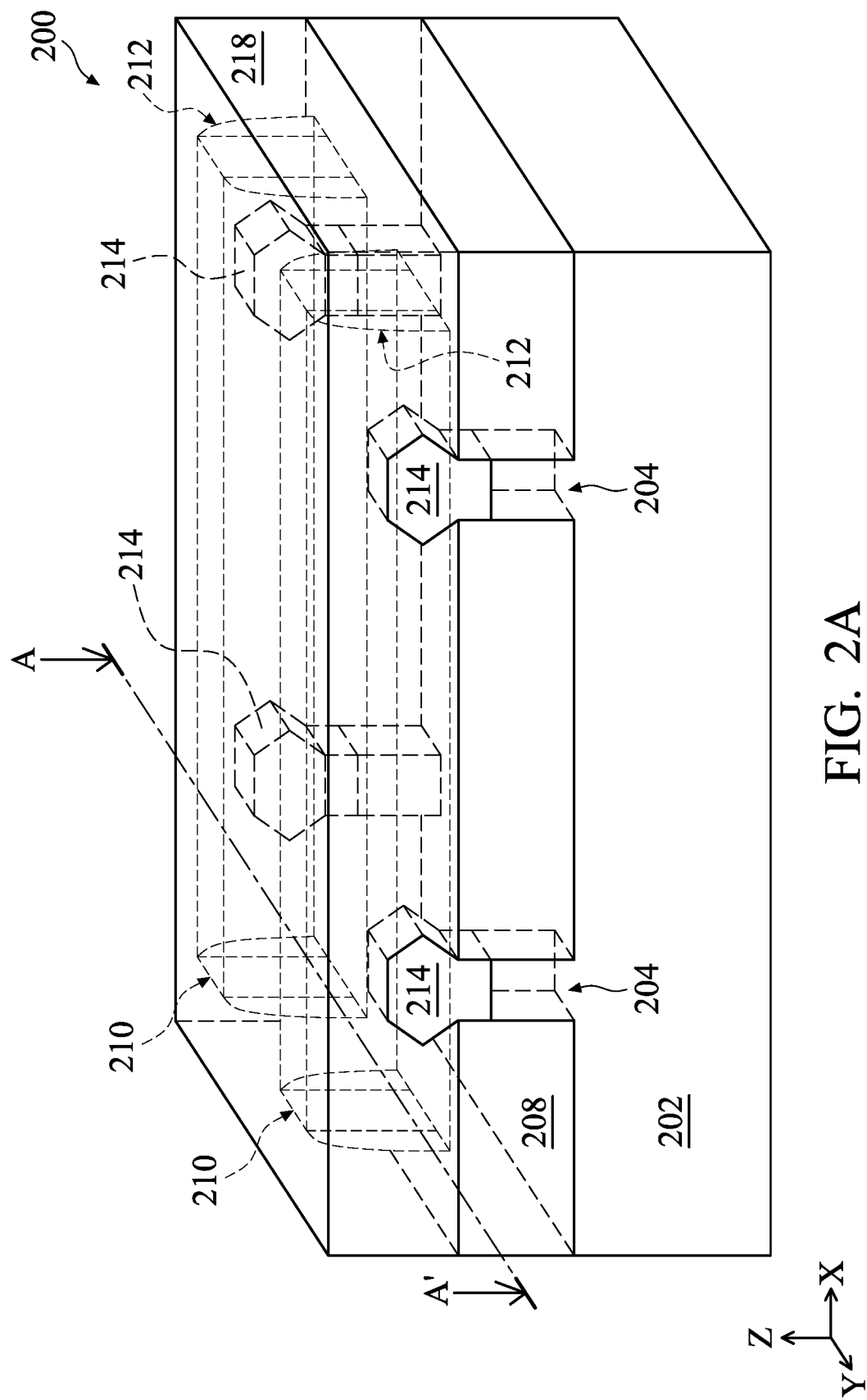
FIG. 2A is a perspective three-dimensional view of an embodiment of a semiconductor device according to various aspects of the present disclosure.

FIG. 1 illustrates an embodiment of a method 100 for forming a semiconductor device 200 according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-19C, which illustrate a portion of the semiconductor device 200 during intermediate steps of the method 100. FIGS. 3-19C are cross-sectional views of the device 200 taken along dashed line AA' as illustrated in FIGS. 2A and/or 2B. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, GAA FETs, metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 2B:
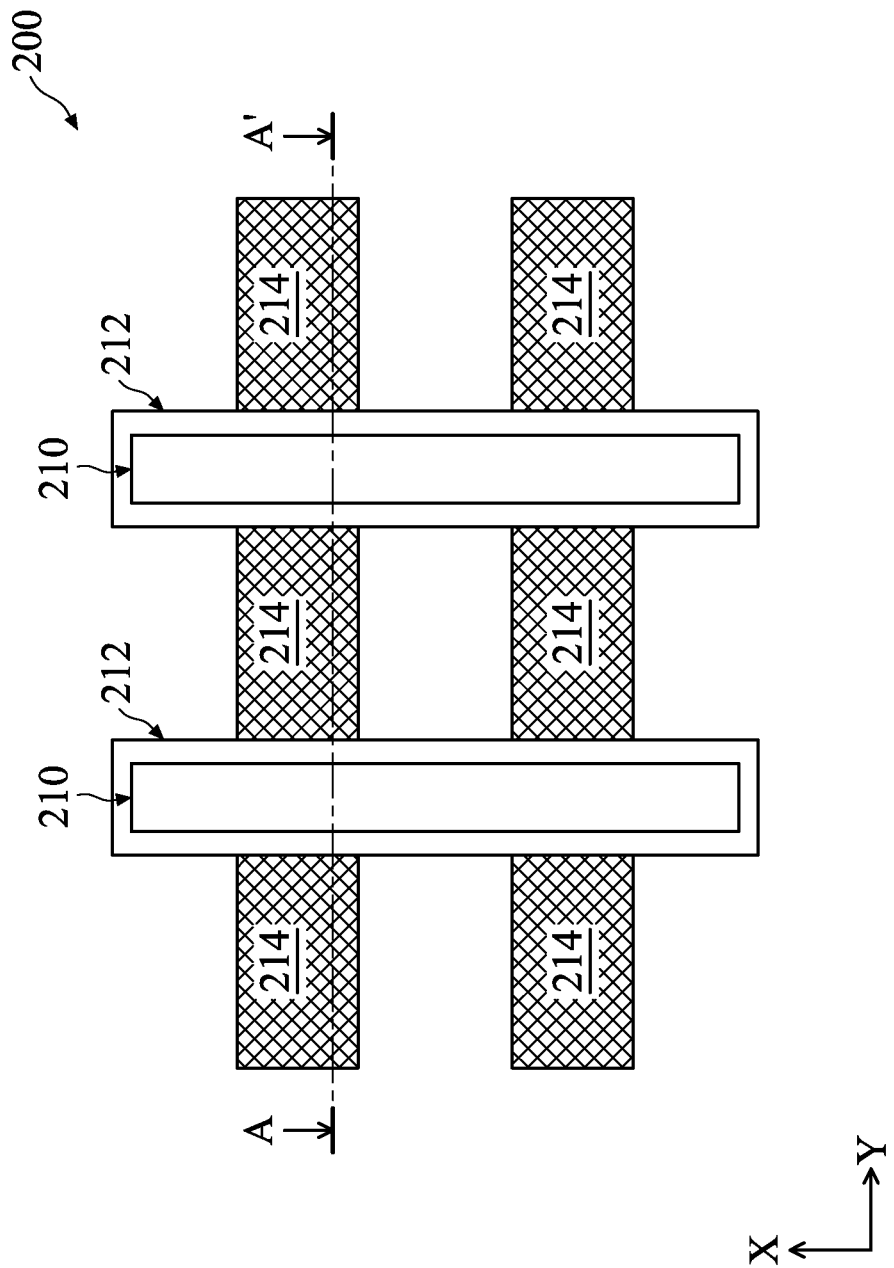
FIG. 2B is a planar top view of an embodiment of a semiconductor device according to various aspects of the present disclosure.
Figure 3:
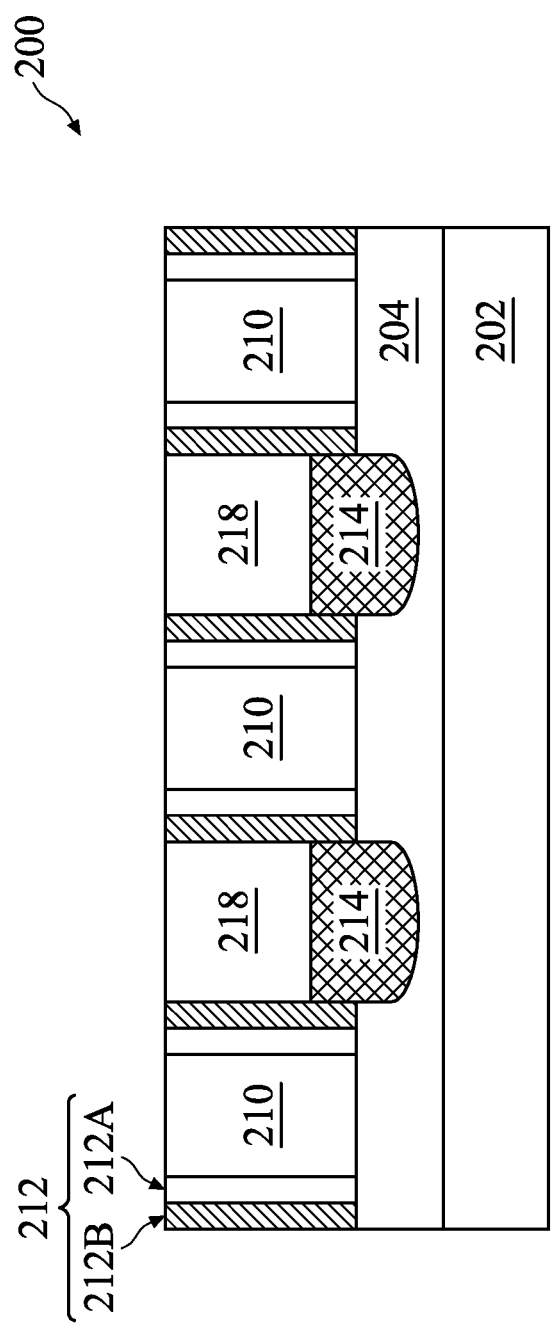
FIGS. 3, 4, 5, 6, 7, 8, 9, 10, 11, 12, 13, 14, 15, 16, 17, 18, 19A, 19B, and 19C are cross-sectional views of an embodiment of the semiconductor device of FIG. 2A and/or FIG. 2B along line AA' during intermediate steps of an embodiment of the method of FIG. 1 according to various aspects of the present disclosure.

At operation 102, referring to FIGS. 2A, 2B, and 3, the method 100 provides a device 200 including a substrate 202 having a three-dimensional active region 204 (hereafter referred to as fin 204) disposed thereover. The device 200 further includes a high-k metal gate (HKMG) structure 210 disposed over the fin 204, gate spacers 212 disposed on sidewalls of the HKMG structure 210, source/drain (S/D) features 214 disposed over the fin 204, isolation structures 208 disposed over the substrate 202 separating various components of the device 200, and an interlayer dielectric (ILD) layer 218 disposed over the isolation structures 208 and the S/D features 214. As depicted in FIGS. 2A and 2B, two fins 204 are present in the device 200. For purposes of clarity, however, methods of the present disclosure will be discussed with reference to one of the two fins 204; of course, the present disclosure is equally applicable to the other one of the two fins 204.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions are formed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 2A, 2B, and 3, the fins 204 may be suitable for forming a p-type or an n-type FinFET. The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization/polishing (CMP) process. Other isolation structures such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A, 2B, and 3, the device 200 includes S/D features 214 disposed over the fins 204 and adjacent to the HKMG structure 210. The S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution and/or other suitable solutions. Subsequently, one or more epitaxial growth processes are performed to grow epitaxial features in the recesses. The S/D features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe) doped with a p-type dopant such as boron, germanium, indium, and/or other p-type dopants. The n-type epitaxial material may include one or more epitaxial layers of silicon (epi Si) or silicon carbon (epi SiC) doped with an n-type dopant such as arsenic, phosphorus, and/or other n-type dopant.

The device 200 further includes the HKMG structure 210 disposed over a portion of the fins 204, such that it interposed between the S/D features 214. The HKMG structure 210 includes a high-k dielectric layer (i.e., having a dielectric constant greater than that of silicon oxide; not depicted) disposed over the fins 204 and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Example work function materials include TiN, TaN, ZrSi$_2$, MoSi$_2$, TaSi$_2$, NiSi$_2$, Ti, Ag, TaAl, TaAlC, TiAlN, TaC, TaCN, TaSiN, Ru, Mo, Al, WN, Mn, Zr, other suitable work function materials, or combinations thereof. The bulk conductive layer may include Cu, W, Ru, Al, Co, other suitable materials, or combinations thereof. The HKMG structure 210 may further include other layers (not depicted), such as an interfacial layer disposed between the fins 204 and the high-k dielectric layer, hard mask layers, capping layers, barrier layers, seed layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof. A polishing process, such as CMP, may be performed to remove excess materials from a top surface of the HKMG structure 210 to planarize a top surface of the device 200.

The device 200 further includes gate spacers 212 disposed on sidewalls of the HKMG structure 210. The gate spacers 212 may be a single-layer structure or a multi-layer structure. In some examples, as depicted herein, the gate spacers 212 are multi-layer structures having a first layer 212A disposed on the sidewalls of the HKMG structure 210 and a second layer 212B disposed on the first layer 212A. Of course, other configurations (e.g., only one spacer layer, more than two spacer layers, etc.) are also applicable to the present embodiments. The gate spacers 212 may include aluminum oxide, aluminum oxynitride, hafnium oxide, titanium oxide, zirconium aluminum oxide, zinc oxide, tantalum oxide, lanthanum oxide, yttrium oxide, silicon oxycarbonitride, tantalum carbonitride, silicon nitride, zirconium nitride, silicon carbonitride, silicon oxide, silicon oxycarbide, hafnium silicide, silicon, zirconium silicide, other suitable materials, or combinations thereof. Notably, the composition of the gate spacers 212 is distinct from that of the surrounding dielectric components, such that an etching selectivity exists between the gate spacers 212 and the surrounding dielectric components during subsequent etching processes. The gate spacers 212 may be formed by first depositing a blanket of spacer material over the device 200, and then performing an anisotropic etching process to remove portions of the spacer material to form the gate spacers 212 on the sidewalls of the HKMG structure 210.

In some embodiments, the HKMG structure 210 is formed after other components of the device 200 (e.g., the S/D features 214) are fabricated. Such process is generally referred to as a gate replacement process, which includes forming a dummy gate structure (not depicted) as a placeholder for the HKMG structure 210, forming the S/D features 214 adjacent to the dummy gate structure, forming the ILD layer 218 (and optionally an etch-stop layer, or ESL) over the dummy gate structure and the S/D features 214, planarizing the ILD layer 218 by, for example, a CMP process, to expose a top surface of the dummy gate structure, removing the dummy gate structure in the ILD layer 218 to form a gate trench (not depicted) that exposes channel regions of the fins 204, and forming the HKMG structure 210 in the gate trench to complete the gate replacement process. In some embodiments, the ILD layer 218 includes a dielectric material, such as a low-k dielectric material, tetraethylorthosilicate (TEOS), silicon oxide, doped silicon oxide such as borophosphosilicate glass (BPSG), fluoride-doped silicate glass (FSG), phosphosilicate glass (PSG), boron doped silicon glass (BSG), other suitable dielectric materials, or combinations thereof. The ILD layer 218 may include a multi-layer structure having multiple dielectric materials and may be formed by a deposition process such as, for example, CVD, FCVD, SOG, other suitable methods, or combinations thereof. If included, the ESL may comprise silicon nitride, silicon oxynitride, silicon nitride with oxygen or carbon elements, other suitable materials, or combinations thereof, and may be formed by CVD, PVD, ALD, other suitable methods, or combinations thereof.

Figure 4:
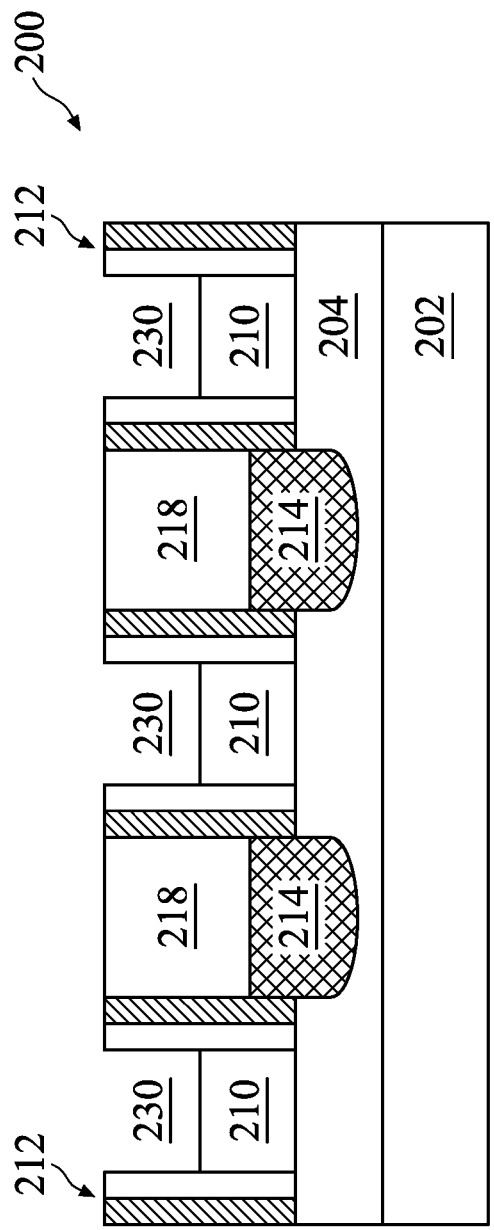
Figure 5:
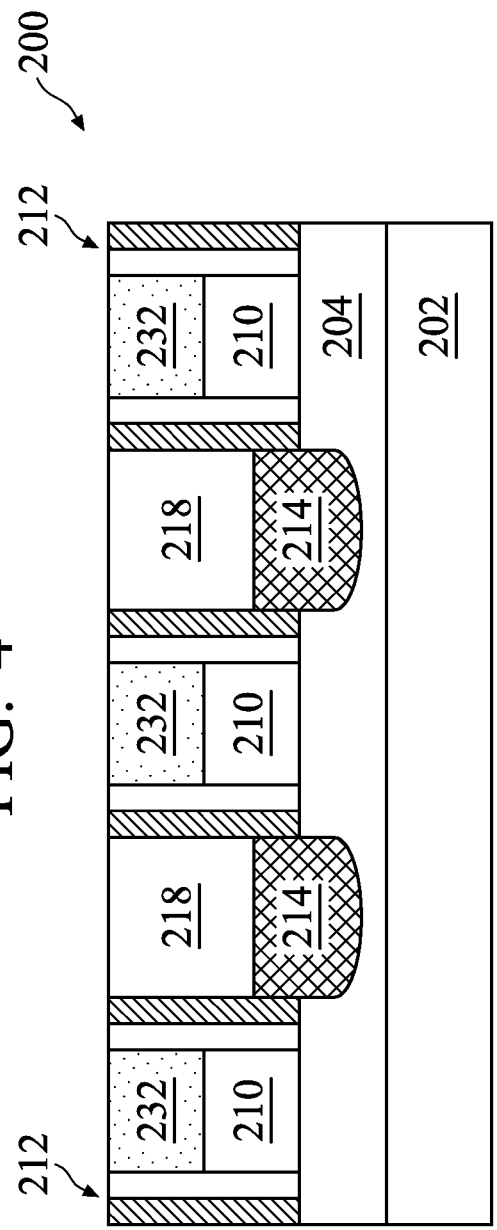

Referring to FIGS. 4 and 5, the method 100 at operation 104 forms a dielectric layer 232 over the HKMG structures 210. Referring to FIG. 4, the method 100 first removes portions of the HKMG structures 210 to form trenches 230. In some embodiments, the method 100 performs an etching process, such as a dry etching process, to form the trenches 230. The etching process selectively removes the HKMG structures 210 with respect to the ILD layer 218, such that the ILD layer 218 is not etched or only minimally etched. Referring to FIG. 5, the method 100 then forms the dielectric layer 232 in the trenches 230. In the present embodiments, the method 100 deposits a dielectric material by a suitable method, such as CVD, FCVD, ALD, PVD, other suitable methods, or combinations thereof. The dielectric layer 232 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. In the present embodiments, a composition of the dielectric layer 232 is different from that of the gate spacers 212. Thereafter, the method 100 planarizes a top surface of the device 200 using a suitable method such as CMP to expose a top surface of the ILD layer 218. In some embodiments, as depicted in FIG. 5, the CMP process results in a top surface of the dielectric layer 232 being substantially planar with the top surface of the ILD layer 218 and the gate spacers 212. In some embodiments, the dielectric layer 232 and the subsequently-formed dielectric layer 242 are optional and may be omitted in the device 200.

Figure 6:
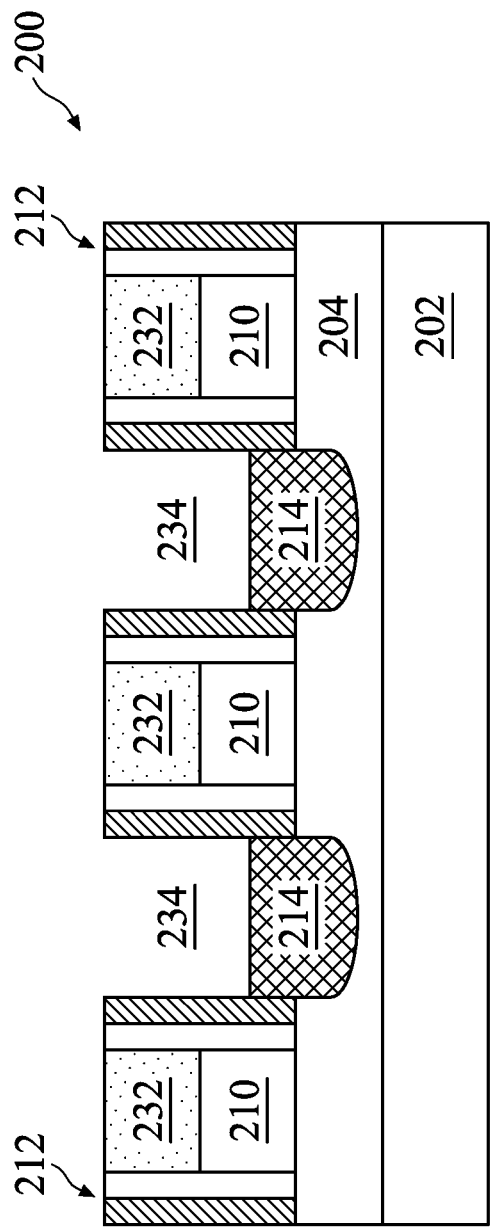
Figure 7:
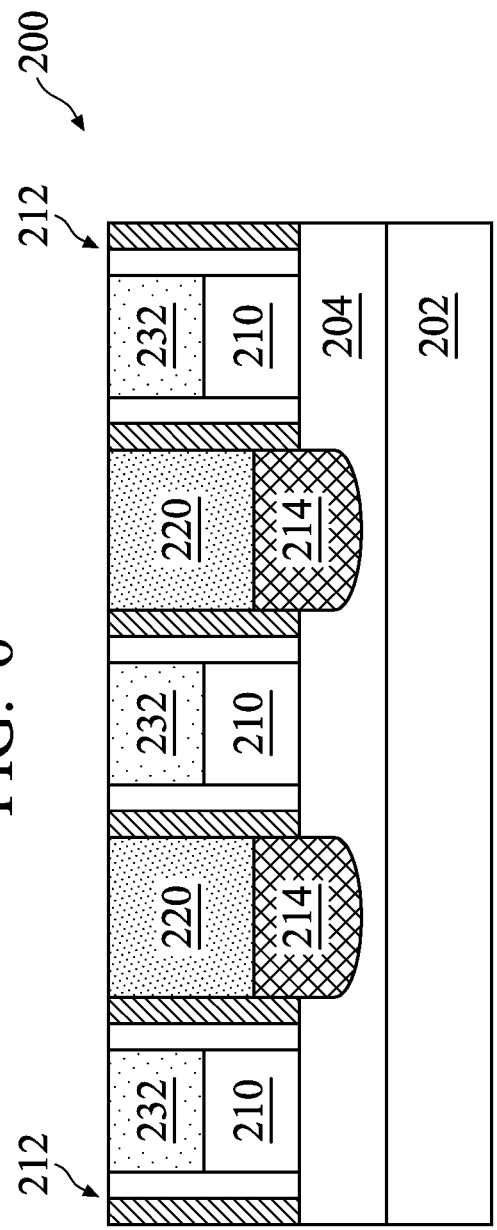

Referring to FIGS. 6 and 7, the method 100 at operation 106 forms S/D contacts 220 over the S/D features 214. Referring to FIG. 6, the method 100 removes portions of the ILD layer 218 disposed over the S/D features 214 to form trenches 234. The method 100 may implement any suitable etching process (e.g., dry etching, wet etching, RIE, etc.) to form the trenches 234. In some embodiments, the etching process is a dry etching process that employs one or more etchant, such as $C_4F_6$, oxygen, hydrogen, other suitable gases, or combinations thereof. Referring to FIG. 7, the method 100 then deposits a conductive material in the trenches 234 and over portions of the dielectric layer 232. The conductive material may include Co, W, Ru, Cu, Ta, Ti, Al, Mo, other suitable materials, or combinations thereof. The conductive material may be deposited by any suitable method, such as CVD, PVD, ALD, plating, other suitable methods, or combinations thereof. In some embodiments, a barrier layer (not depicted) is formed in the trenches 234 before depositing the conductive material. The barrier layer may include TiN, TaN, other suitable materials, or combinations thereof, and may be deposited by, for example, an ALD process. Thereafter, still referring to FIG. 7, the method 100 planarizes the conductive material using a suitable method such as CMP to form the S/D contacts 220 over the S/D features 214. In some embodiments, portions of the conductive material formed over the dielectric layer 232 are removed by the CMP process, such that a top surface of the S/D contacts are substantially planar with a top surface of the dielectric layer 232.

Figure 8:
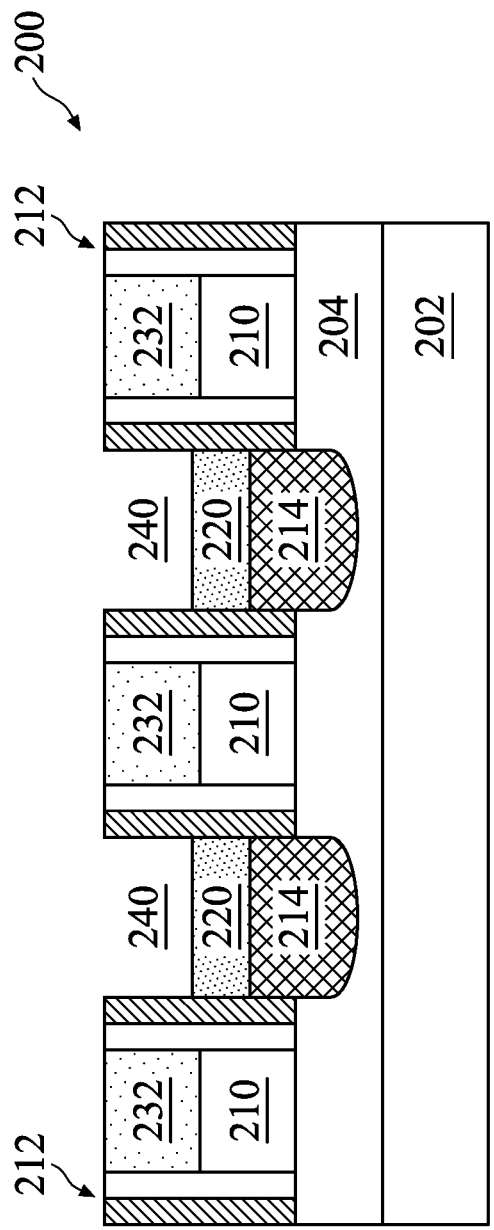
Figure 9:
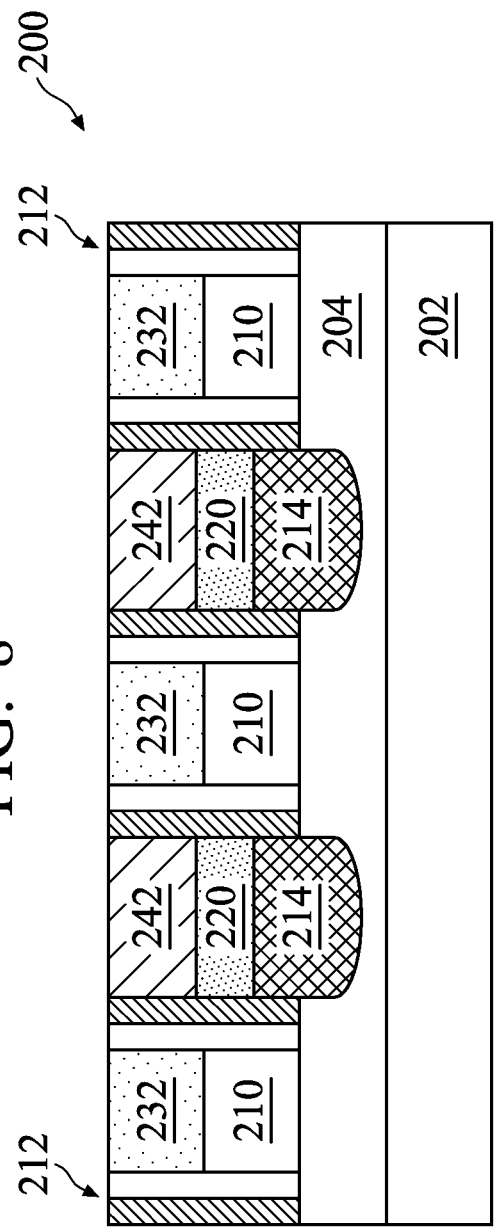

Referring to FIGS. 8 and 9, the method 100 at operation 108 forms a dielectric layer 242 over the dielectric layer 232 and the S/D contacts 220. In some embodiments, referring to FIG. 8, the method 100 first removes portions of the S/D contacts 220 to form trenches 240, which are disposed between the gate spacers 212. The method 100 may implement any suitable etching process (e.g., dry etching, wet etching, RIE, etc.) to form the trenches 240. In the present disclosure, the etching process may be a wet etching process that employs an acid, such as sulfuric acid ($H_2SO_4$), as an etchant. In some embodiments, the wet etching process is controlled by the duration of the etching process. Referring to FIG. 9, the method 100 then deposits a dielectric layer 242 in the trenches 240 and over portions of the dielectric layer 232 using any suitable method, such as CVD, FCVD, ALD, PVD, other suitable methods, or combinations thereof. The dielectric layer 242 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. Notably, in the present disclosure, the dielectric layer 242 has a composition different from that of the dielectric layer 232 and the gate spacers 212, such that they would exhibit etching selectivity when subjected to a subsequent etching process. Thereafter, still referring to FIG. 9, the method 100 planarizes the top surface of the device 200 to expose the top surface of the dielectric layer 232 and the gate spacers 212, such that a top surface of the dielectric layer 242 is substantially planar with the top surface of the dielectric layer 232.

Figure 10:
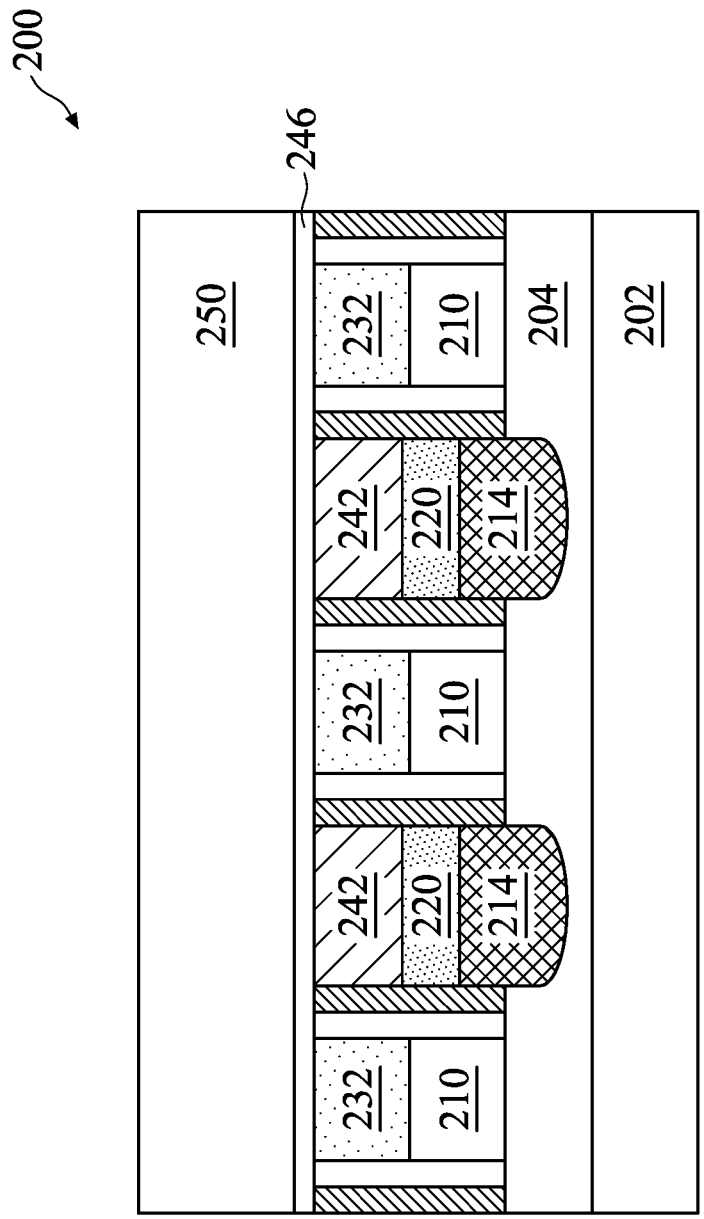
Figure 11:
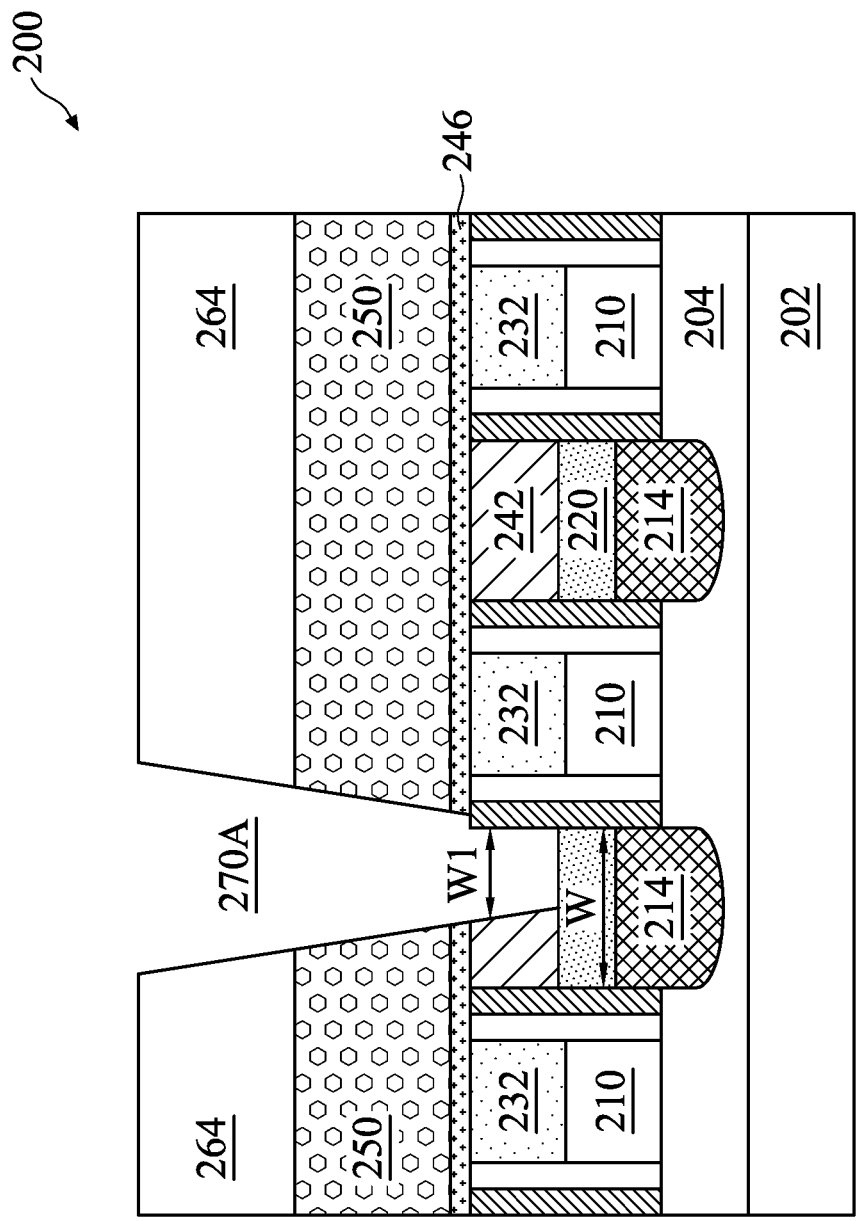
Figure 12:
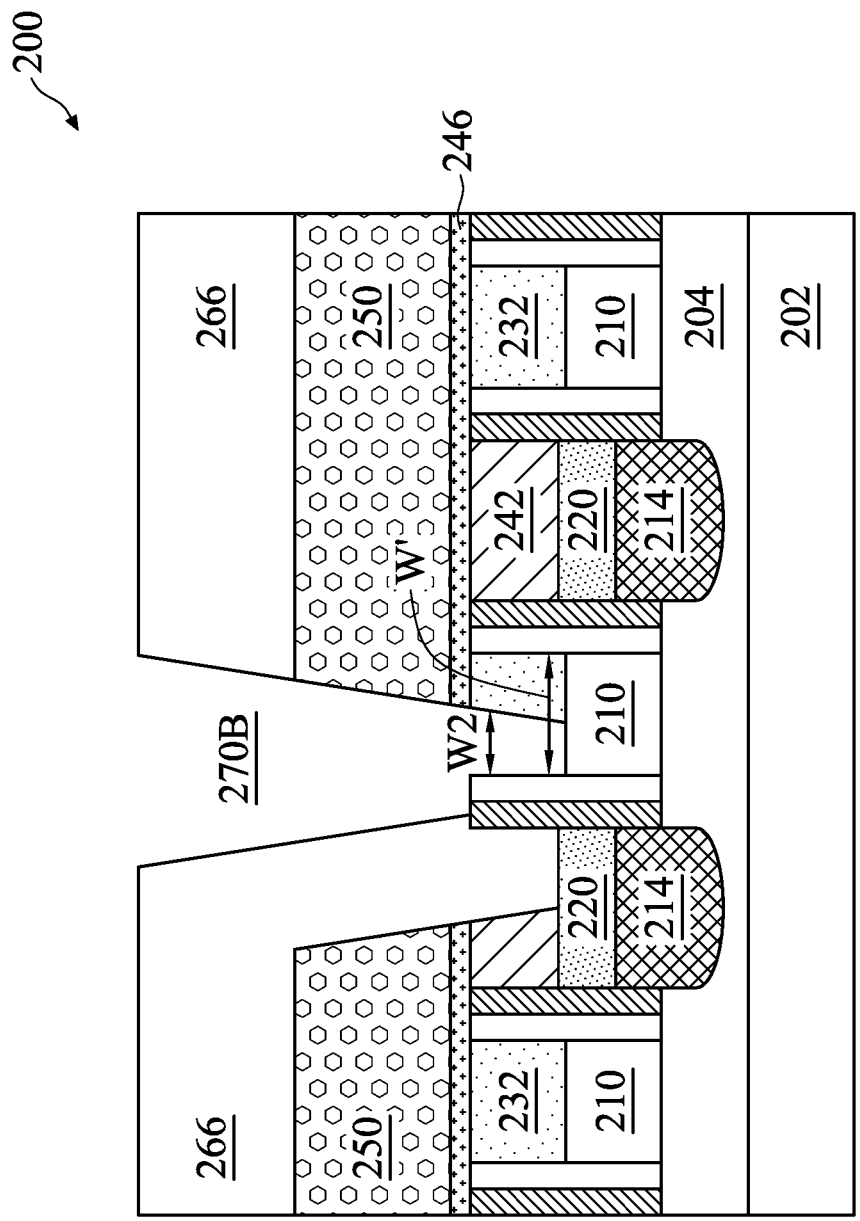
Figure 13:
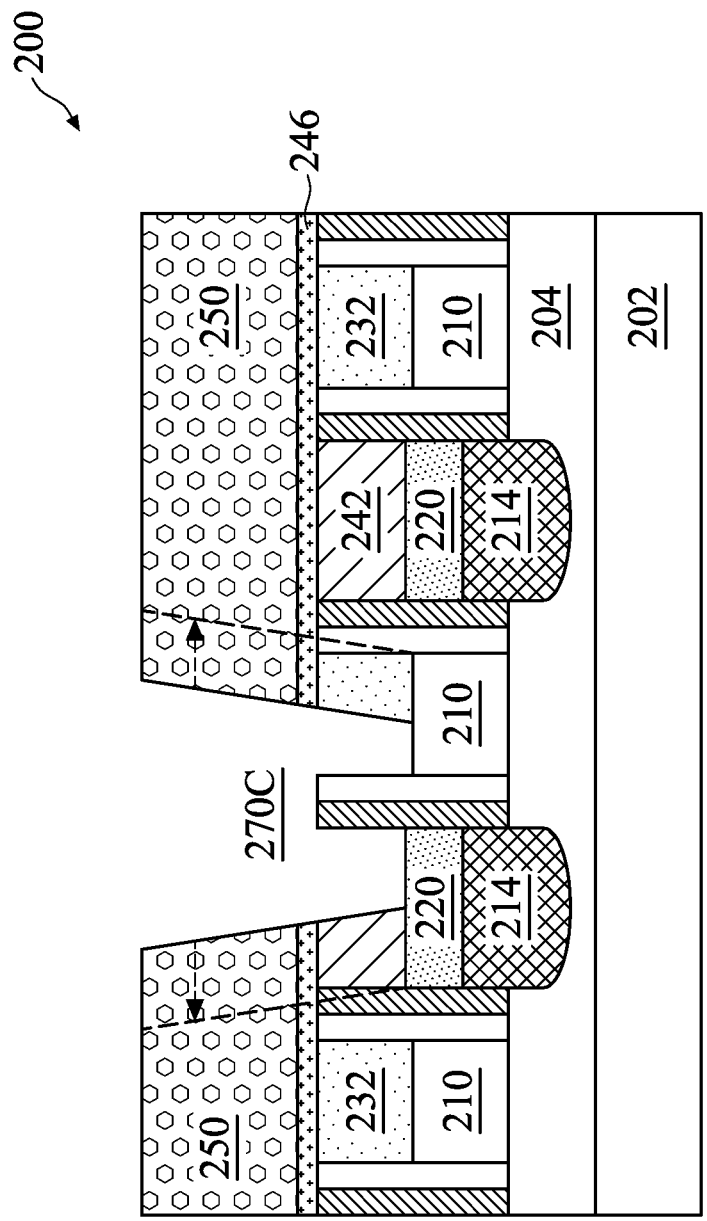

Referring to FIGS. 10-13, the method 100 at operation 110 forms an opening 270C (as depicted in FIG. 13) in an ILD layer 250 to expose one of the S/D contacts 220 and one of the HKMG structures 210. Referring to FIG. 10, the method 100 first forms an ESL 246 over the device 200 and subsequently forms the ILD layer 250 thereover. In some embodiments, the ESL 246 is omitted from the device 200. The ESL 246 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. Notably, the gate spacers 212, the dielectric layer 232, the dielectric layer 242, and the ESL 246 may have different compositions so that they may exhibit etching selectivity when subjected to one or more subsequent etching processes. In some embodiments, the method 100 deposits the ESL 246 using any suitable method, such as CVD, ALD, other suitable methods, or combinations thereof. Thereafter, the method 100 forms an ILD layer 250 over the ESL 246 using any suitable method, such as CVD, FCVD, SOG, other suitable methods, or combinations thereof. The ILD layer 250 may have a similar composition as the ILD layer 218 and may be formed by a similar process as discussed above with respect to the ILD layer 218. The ILD layer 250 may include a multi-layer structure having multiple dielectric materials.

Subsequently, the method 100 forms the opening 270C to expose portions of the device 200. In the present embodiments, the opening 270C may be formed in two processing steps or, alternatively, in a single processing step. For example, referring to FIGS. 11 and 12, a first opening 270A and a second opening 270B are formed separately in the device 200. Referring to FIG. 11, the method 100 first forms a patterned masking element 264 having an opening configured to expose at least a portion of the S/D contact 220. Forming the patterned masking element 264 may include forming at least a resist layer (e.g., photoresist layer; not depicted) over the device 200, exposing the resist layer to a radiation source (e.g., extreme ultraviolet, or EUV, radiation) through a photomask, and subsequently developing the exposed resist layer to form the patterned masking element 264. The portions of the device 200 exposed by the patterned masking element 264 are then removed to expose at least a portion of the S/D contact 220 in the opening 270A. In the present embodiments, a composition of the gate spacers 212 and/or a suitable etchant is chosen such that the gate spacers 212 are not etched or only minimally etched with respect to the ILD layer 250, the ESL 246, and the dielectric layer 242. Thereafter, the patterned masking element 264 is removed from the device 200 by a suitable method, such as resist stripping and/or plasma ashing. It is understood that the embodiment depicted in FIG. 11 is a mere example, and the opening 270A may expose the entirety of the S/D contact 220 in some embodiments. In other words, a width W1 of the opening 270A may be as large as a width W of the S/D contact 220.

Subsequently, referring to FIG. 12, a second opening 270B is formed adjacent to the first opening 270A to expose at least a portion of the HKMG structure 210. The method 100 may form the opening 270B in a similar manner as forming the opening 270A as discussed above. For example, a patterned masking element 266 may be formed over the device 200, a process during which the first opening 270A may be re-filled by the patterned masking element 266. Then, portions of the device 200 exposed by the patterned masking element 266 are etched to expose at least a portion of the HKMG structure 210. In some embodiments, the gate spacers 212 are not etched or only minimally etched similar to that discussed above with respect to the forming of the opening 270A. As in the case for the opening 270A, a width W2 of the opening 270B may be as large as a width W' of the HKMG structure 210.

Now referring to FIG. 13, removing the patterned masking element 266 (by resist stripping and/or plasma ashing) results in the opening 270C. As indicated by the dotted lines and arrows, sidewalls of the opening 270C may be expanded to align with sidewalls of the S/D contact 220 and the HKMG structure 210. It is understood that the opening 270C is configured to expose only one S/D contact and one HKMG structure adjacent to the S/D contact such that a butted contact (e.g., butted contact 280 depicted in FIGS. 14-19C) may be subsequently formed in the opening 270C. In alternative embodiments, the opening 270C is formed in a single processing step. For example, a patterned masking element (not depicted) may be formed over the ILD layer 250, where the patterned masking element is configured to expose at least portions of the S/D contact 220 and the HKMG structure 210. Subsequently, portions of the device 200 exposed in the opening are etched to form the opening 270C, after which the patterned masking element is removed from the device 200.

Figure 14:
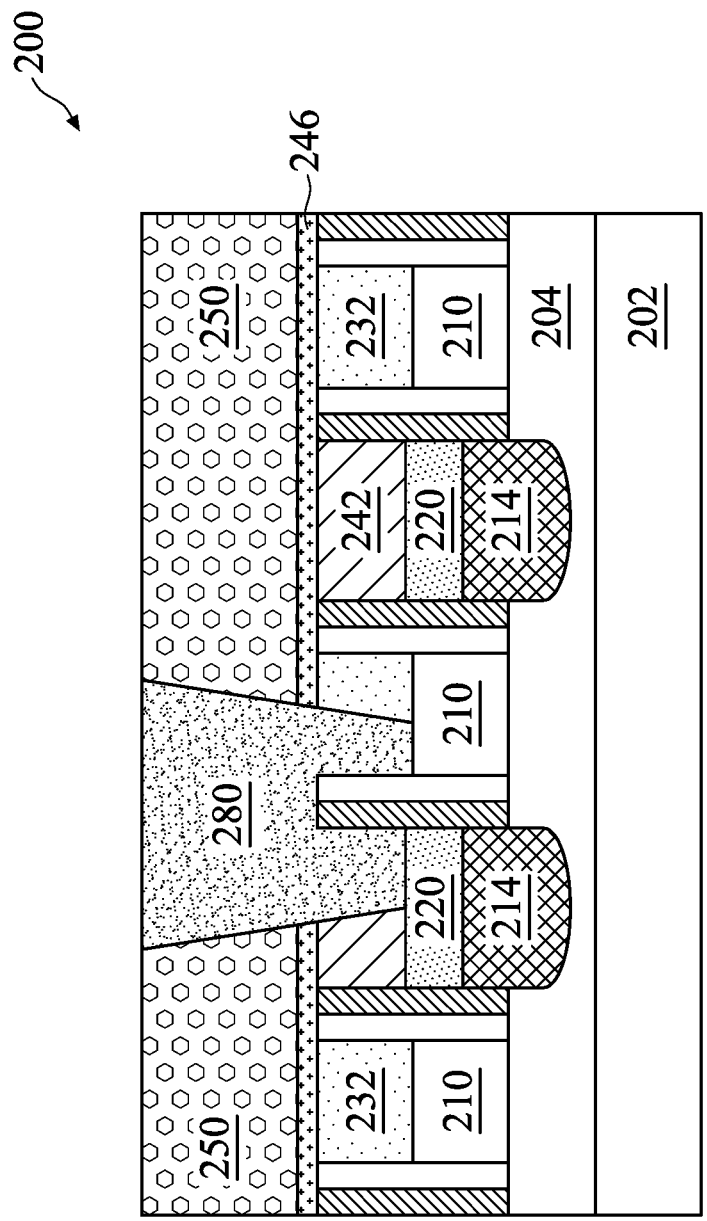

Now referring to FIG. 14, the method 100 at operation 112 forms a butted contact 280 in the opening 270C. Forming the butted contact 280 includes depositing a conductive material over the device 200, thereby filling the opening 270C, and subsequently planarizing the top surface of the device 200 to expose the ILD layer 250. In the present embodiments, the butted contact 280 is configured to electrically connect the S/D contact 220 (i.e., the S/D features 214) with the HKMG structure 210. The butted contact 280 may include any suitable conductive material, such as Co, W, Ru, Cu, Ta, Ti, Al, Mo, other suitable conductive materials, or combinations thereof. In some embodiments, a composition of the butted contact 280 is substantially similar to or the same as that of the S/D contact 220. The conductive material may be deposited in the opening 270C by any suitable method, such as CVD, PVD, plating, other suitable methods, or combinations thereof. In some embodiments, a barrier layer (not depicted) is formed in the opening 270C before forming the butted contact 280. The barrier layer may include TiN, TaN, other suitable materials, or combinations thereof, and may be deposited by, for example, an ALD process.

Figure 15:
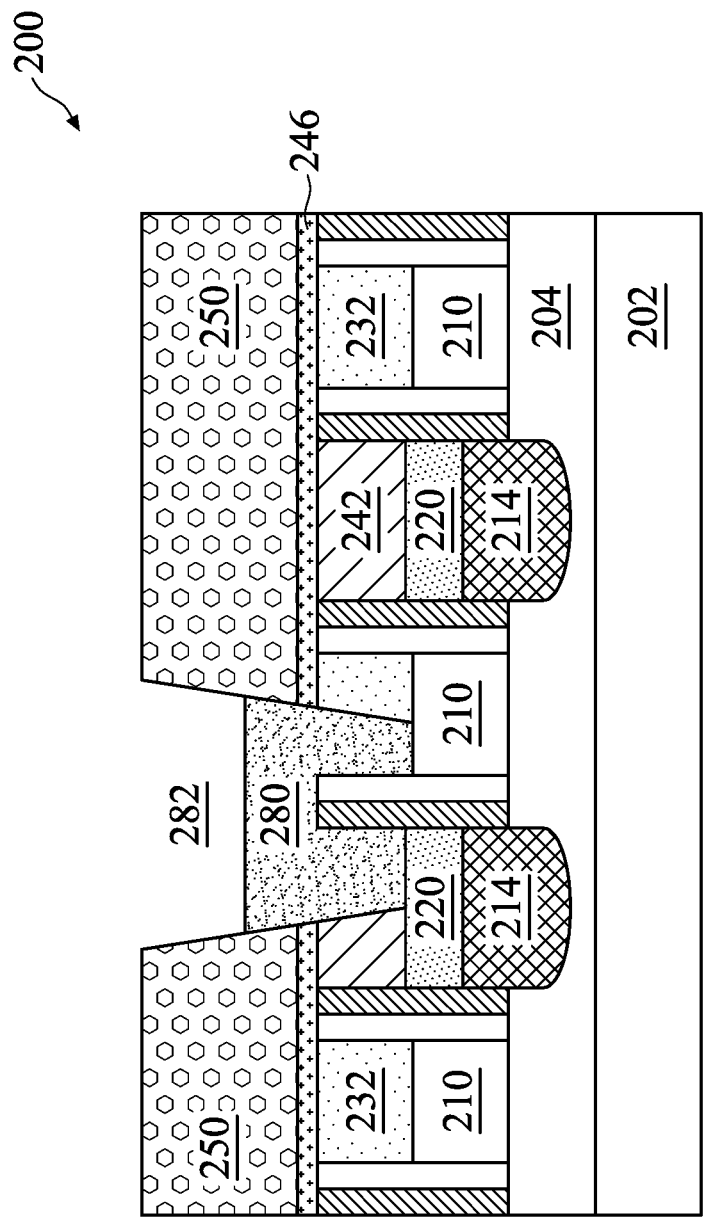

Subsequently, referring to FIG. 15, the method 100 at operation 114 removes a top portion of the butted contact 280 to form an opening 282. Because of the difference in composition between the ILD layer 250 and the butted contact 280, the method 100 may selectively remove the top portion of the butted contact 280 with respect to the ILD layer 250 in an etching process without needing to apply a patterned masking layer. In other words, the etching process at operation 114 forms the opening 282 in a self-aligned manner. The etching process implemented at operation 114 may be any suitable etching process, such as a dry etching process, a wet etching process, RIE, or combinations thereof. In the present embodiments, the etching process is a dry etching process or RIE utilizing a chlorine-containing gas (e.g., $Cl_2$, $CHCl_3$, $CCl_4$, and/or $BCl_3$) as an etchant. In some embodiments, a depth of the opening 282 is controlled by adjusting the duration of the etching process at operation 114. The depth of the opening 282 is not limited to a specific value in the present embodiments so long as it is less than a separation distance measured from a top surface of the ILD layer 250 to a top surface of the gate spacers 212 that separate the neighboring S/D contact 220 and the HKMG structure 210. In other words, a top surface of the remaining portion of the butted contact 280 should be sufficiently higher than the top surface of the gate spacers 212 such that the butted contact 280 remains functional in electrically connecting the S/D contact 220 to the HKMG structure 210. In some examples, the depth of the opening 282 may be about 5 nm to about 20 nm.

Figure 16:
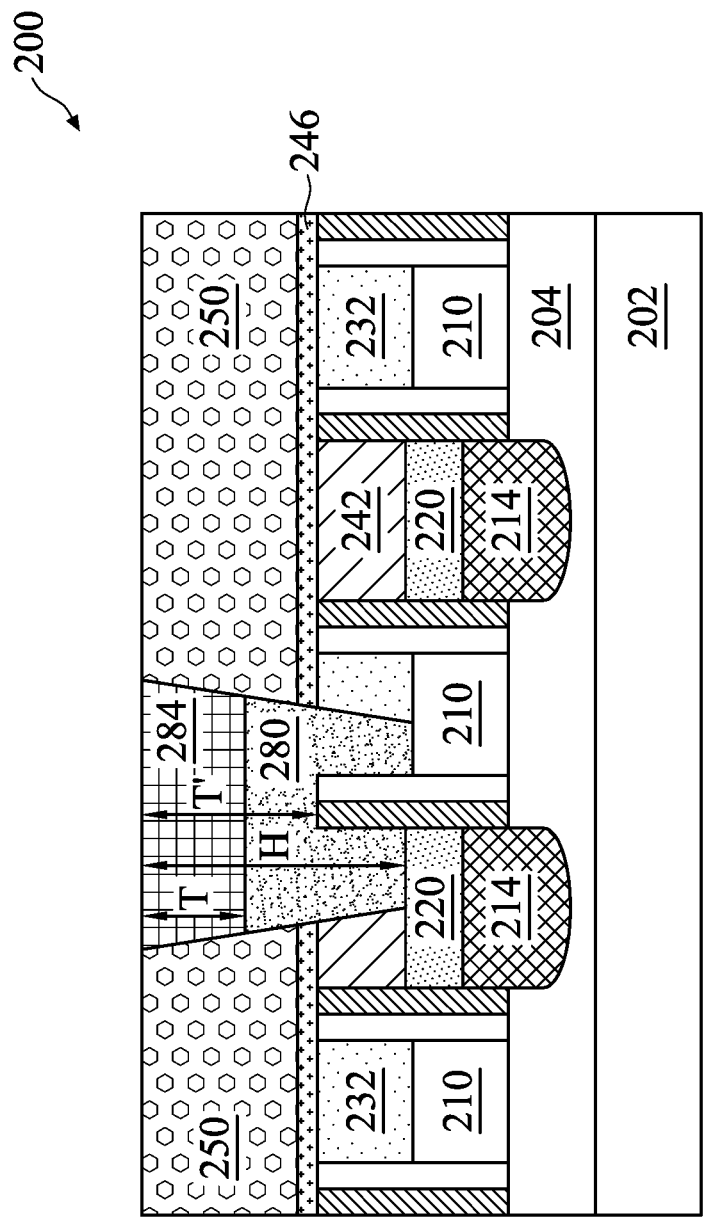

Subsequently, referring to FIG. 16, the method 100 at operation 116 forms a dielectric layer 284 over the remaining portion of the butted contact 280, thereby filling the opening 282. The dielectric layer 284 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. The dielectric layer 284 may have a composition substantially similar to or the same as that of the dielectric layer 232, the dielectric layer 242, and/or the ESL 246. In other words, the present embodiments do not limit the composition of the dielectric layer 284 to be different from one or more of the dielectric layer 232, the dielectric layer 242, and the ESL 246. The method 100 may deposit the dielectric layer 284 using any suitable method, such as ALD, CVD, FCVD, PVD, other suitable methods, or combinations thereof, and subsequently perform a CMP process to expose the top surface of the ILD layer 250. In an example embodiment, the dielectric layer 284 is deposited using an ALD process.

As discussed above with respect to the depth of the opening 282, a thickness T of the dielectric layer 284 should not exceed a separation distance T' between a top surface of the dielectric layer 284 and the top surface of the gate spacers 212 to ensure that the butted contact 280 electrically connects the S/D contact 220 with the HKMG structure 210. In some embodiments, a ratio of the thickness T to a combined thickness H of the dielectric layer 284 and the butted contact 280 is at least about 1:9 to ensure that the dielectric layer 284 provides sufficient isolation between the butted contact 280 and a subsequently-formed interconnect structure (e.g., interconnect structure 296 discussed in detail below). In some examples, the thickness T is about 5 nm to about 15 nm, and the separation distance T' is about 10 nm to about 30 nm. Of course, the present embodiments are not limited to these numeric ranges and other numeric ranges may also be applicable so long as the functions of the dielectric layer 284 and the butted contact 280 are properly maintained as discussed above.

Figure 17:
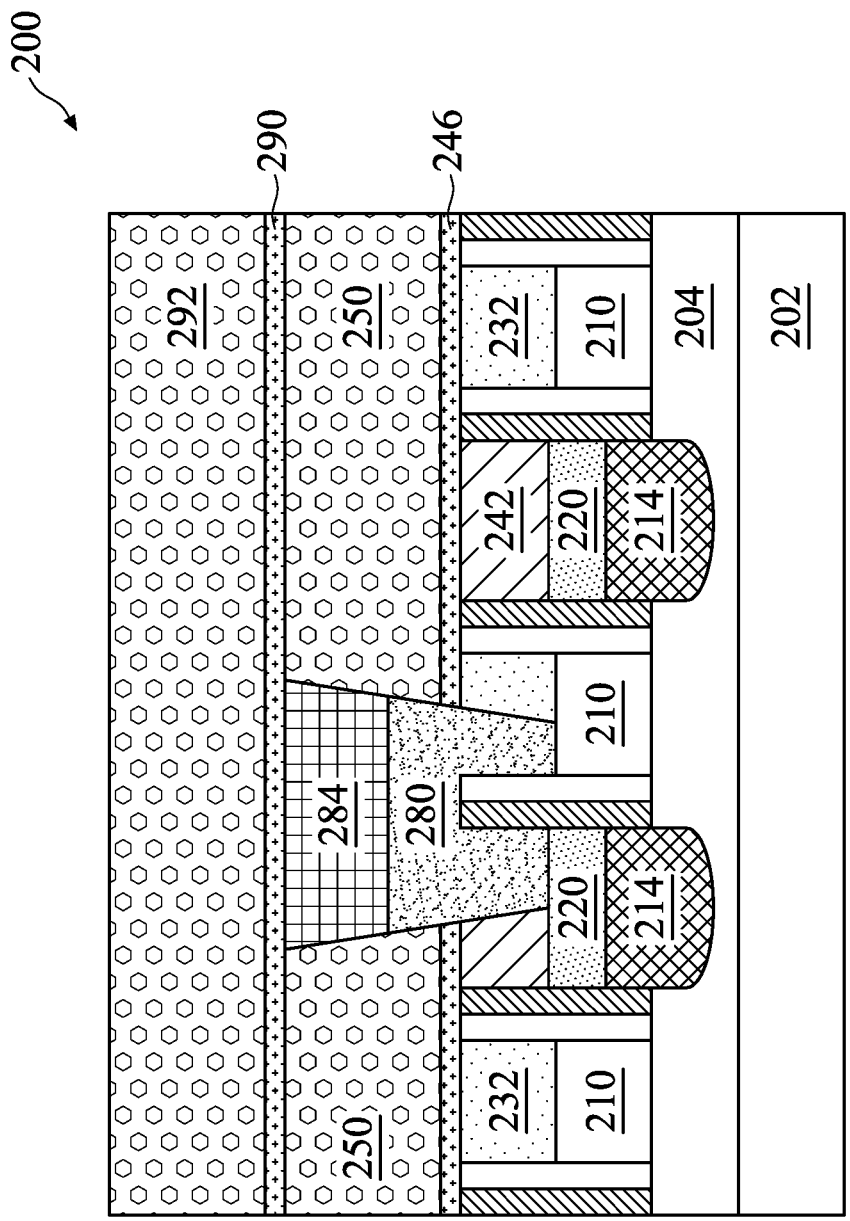
Figure 18:
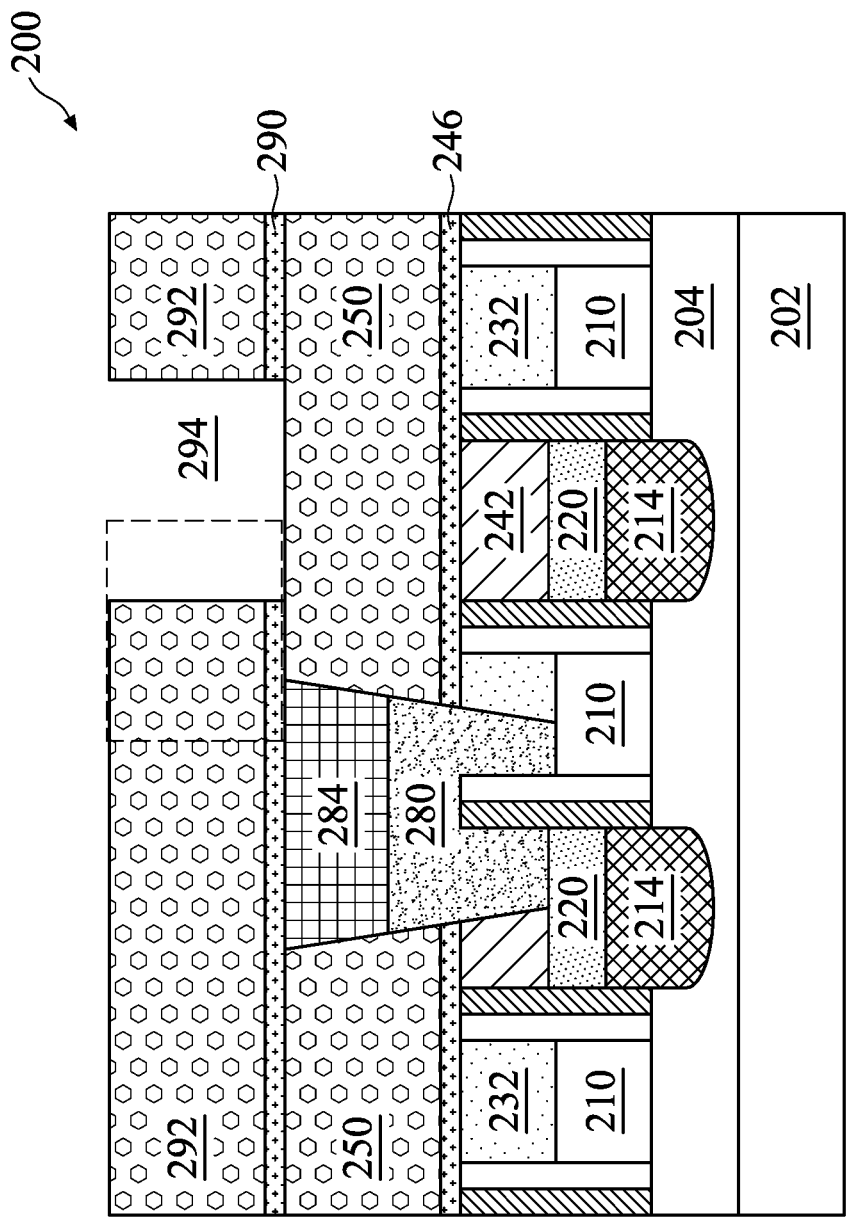
Figure 19A:
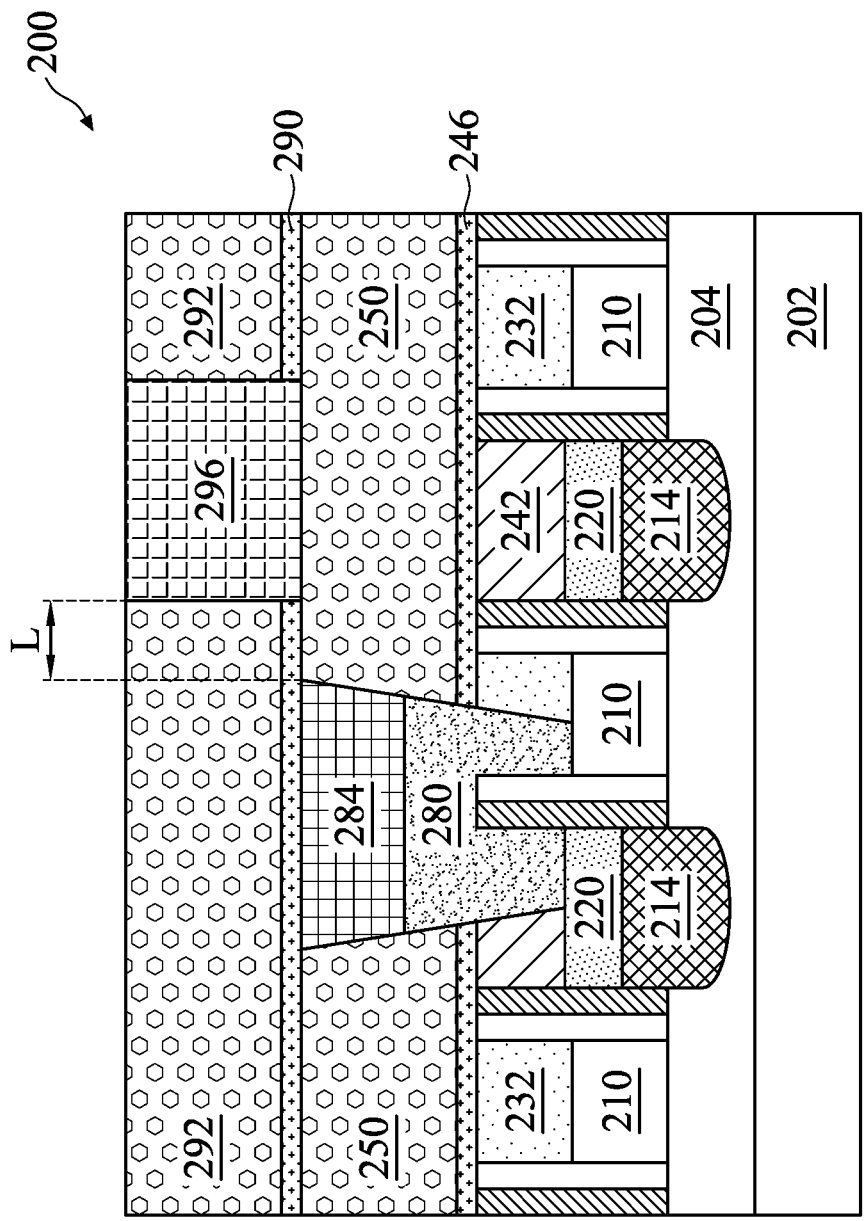
Figure 19B:
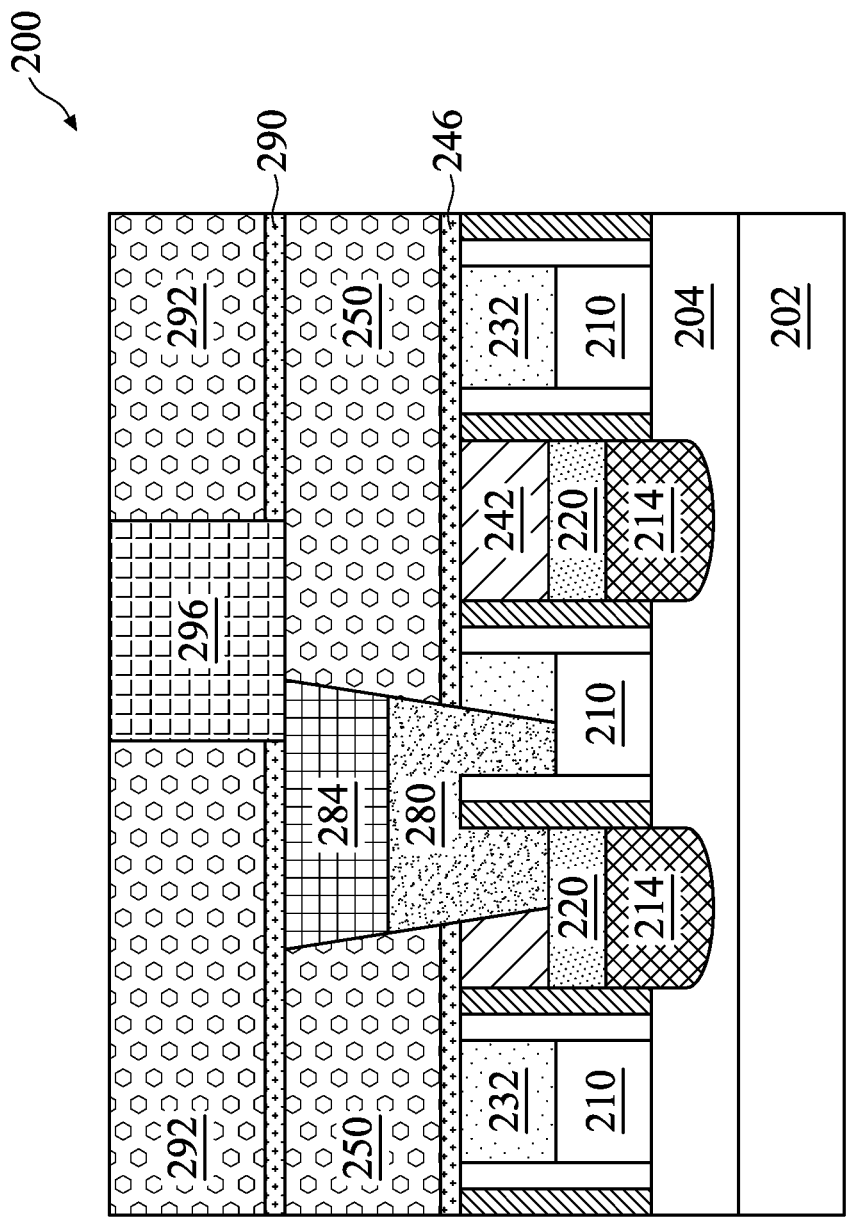
Figure 19C:
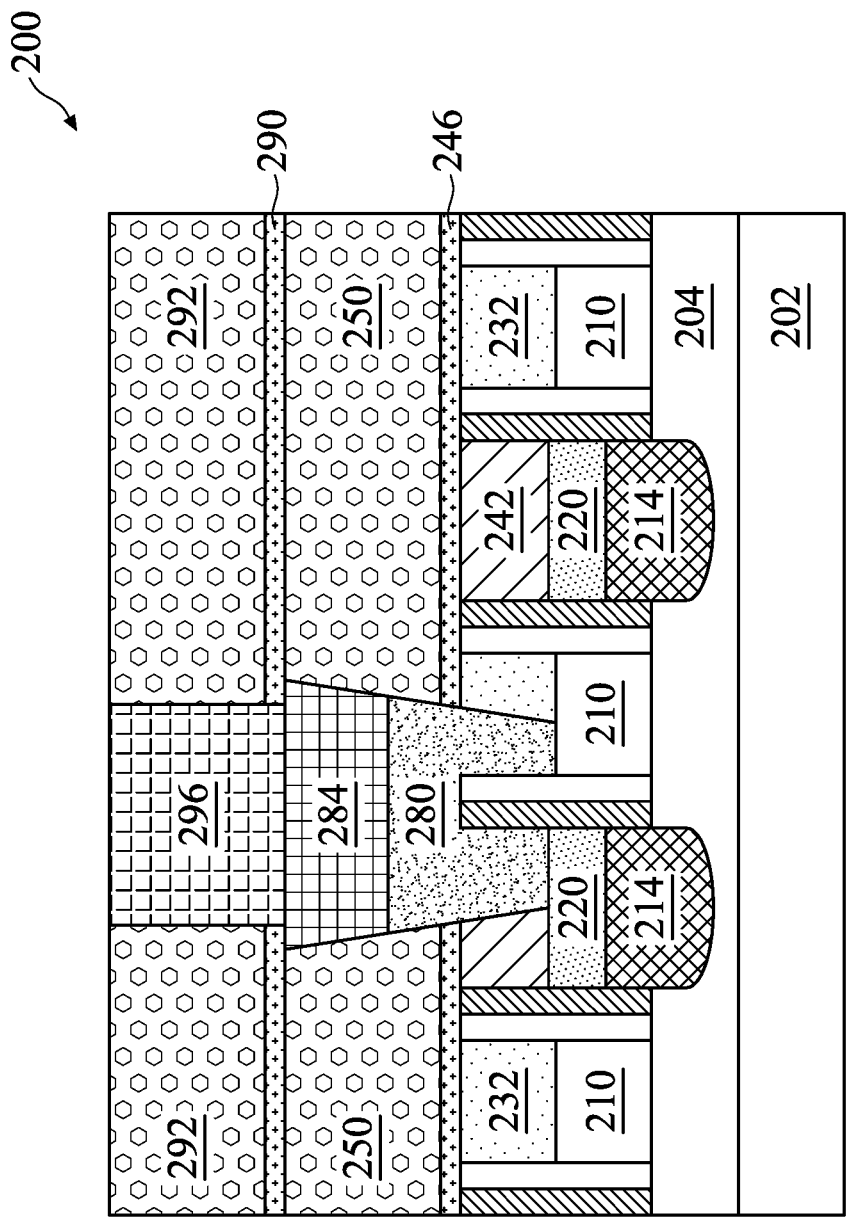

Now referring to FIGS. 17-19C, the method 100 at operation 118 forms an interconnect structure 296 (as depicted in FIGS. 19A-19C) over the ILD layer 250. Referring to FIG. 17, the method 100 first forms an ESL 290 over the ILD layer 250 and an ILD layer 292 over the ESL 290. In some embodiments, the ESL 290 is omitted from the device 200. The ESL 290 may be similar to the ESL 246 in composition and may be deposited in any suitable method as discussed above with respect to the ESL 246. The ILD layer 292 may be similar to the ILD layer 218 and/or the ILD layer 250 and may be formed by any suitable method as discussed above with respect to the ILD layer 218.

Referring to FIG. 18, the method 100 then forms a trench 294 that extends through the ILD layer 292 (and the ESL 290 if present). The trench 294 may be formed by a series of patterning and etching processes similar to those discussed above with respect to operation 110. For example, a patterned masking element (not depicted) exposing portions of the ILD layer 292 and the ESL 290 may be formed over the ILD layer 250, and the exposed portions are then removed by a suitable etching process (e.g., a dry etching process), thereby forming the trench 294. The present embodiments do not limit the dimension of the trench 294 so long as it meets the design requirement for forming an interconnect structure therein. As will be discussed in detail below, the trench 294 may be formed in a position completely offset from the dielectric layer 284 as depicted in FIG. 18, such that it does not expose any portion of the dielectric layer 284; alternatively, the trench 294 may be configured to expose a portion of the dielectric layer 284 as indicated by the dotted outline of the trench 294.

Referring to FIGS. 19A-19C, the method 100 deposits a conductive material in the trench 294 to form an interconnect structure 296. The interconnect structure 296 may be any structure suitable for interconnecting one or more components of the device 200 with subsequently-formed components. For example, the interconnect structure 296 may be a horizontal interconnect structure, such as a conductive line. It is understood that the ILD layer 292 may include additional interconnect structures (e.g., vias, conductive lines, etc.) not depicted herein. Furthermore, it is understood that the interconnect structure 296 may contact one or more components of the device 200 (e.g., gate contacts, S/D contacts, etc.) not depicted herein. The interconnect structure 296 may include Co, W, Ru, Cu, Ta, Ti, Al, Mo, other suitable conductive materials, or combinations thereof, and may be deposited by any suitable method, such as CVD, PVD, plating, other suitable methods, or combinations thereof. In some embodiments, a barrier layer (not depicted) is formed in the trench 294 before forming the interconnect structure 296. The barrier layer may include TiN, TaN, other suitable materials, or combinations thereof, and may be deposited by, for example, an ALD process. After depositing the conductive material(s), the method 100 performs a CMP process to planarize the device 200, thereby exposing a top surface of the ILD layer 292. Thereafter, the method 100 at operation 120 may implement additional processing steps, such as forming additional interconnect structures in the ILD layer 292 and/or forming additional ILD layers over the ILD layer 292 and subsequently forming additional interconnect structures therein.

With respect to the example embodiment in FIG. 19A, the interconnect structure 296 is laterally offset from the dielectric layer 284 by a distance L. If the butted contact 280 extends vertically to contact the ESL 290, i.e., if the dielectric layer 284 is absent from the device 200, the distance L must be maintained at a minimum distance of about 5 nm to prevent electrical shorting between the interconnect structure 296 and the butted contact 280. Of course, such a configuration would lengthen the lateral dimension of the device 200, thereby limiting the density of various features of the device 200.

In contrast, as depicted in FIGS. 19B and 19C, the presence of the dielectric layer 284 over the butted contact 280 eliminates the need for maintaining the distance L, such that the interconnect structure 296 may laterally overlap with the dielectric layer 284 as depicted in FIG. 19B or, alternatively, may be formed directly above the dielectric layer 284 (i.e., a bottom surface of the interconnect structure 296 is defined by a top surface of the dielectric layer 284). Stated differently, because shorting between the interconnect structure 296 and the butted contact 280 could be prevented by the insertion of the dielectric layer 284, the lateral dimension of the device 200 may be reduced and the density of various features in the device 200 may be improved. Furthermore, the insertion of the dielectric layer 284 between the butted contact 280 and the interconnect structure 296 may result in lowered parasitic capacitance and resistance of the device 200 and, in some examples, may increase speed of the device 200 by about 10%. In some examples, the composition of the dielectric layer 284 may be chosen to tune the extent of reduction in parasitic capacitance and/or resistance desired for specific design requirements. For embodiments such as those depicted in FIGS. 19B and 19C, compositions of the dielectric layer 284 and the ESL 290 are chosen to be different to ensure sufficient etching selectivity therebetween when forming the trench 294, such that the dielectric layer 284 may not be inadvertently damaged.

Although not intended to be limiting, one or more embodiments of the present disclosure provide many benefits to a semiconductor device and the formation thereof. For example, embodiments of the present disclosure provide a method including forming a butted contact that includes a dielectric layer disposed over a conductive layer and subsequently forming an interconnect structure over the butted contact. In some embodiments, the interconnect structure laterally overlaps with a portion of the dielectric layer. In some embodiments, the interconnect structure is formed to contact the dielectric layer. Embodiments provided herein allow an interconnect structure to be formed in close proximity with a butted contact in an effort to reduce the overall dimension of the device, increase density of features in the device, and improve performance of the device.

In one aspect, the present disclosure provides a semiconductor structure that includes a metal gate structure (MG) disposed over a semiconductor substrate, a gate spacer disposed on a sidewall of the MG, an S/D contact (MD) disposed over the semiconductor substrate and separated from the MG by the gate spacer, and a contact feature coupling the MG to the MD. In the present embodiments, the contact feature includes a dielectric layer disposed on a metal layer, where the dielectric layer and the metal layer are defined by continuous sidewalls.

In another aspect, the present disclosure provides a semiconductor structure that includes a metal gate stack disposed over a substrate, an S/D feature disposed over the substrate and adjacent to the metal gate stack, and an S/D contact disposed on the S/D feature. The semiconductor structure further includes a first ILD layer disposed over the S/D contact, a butted contact disposed in the first ILD layer, a dielectric layer disposed on the butted contact, a second ILD layer disposed over the first ILD layer, and a conductive feature disposed in the second ILD layer. In the present embodiments, the butted contact extends from the first ILD layer to contact both the metal gate stack and the S/D contact and, furthermore, sidewalls of the dielectric layer are defined by the first ILD layer.

In yet another aspect, the present disclosure provides a method of forming a semiconductor structure that includes first forming an MG disposed over a semiconductor layer, a gate spacer disposed on a sidewall of the MG, and a S/D feature disposed in the semiconductor layer and adjacent to the MG, forming an S/D contact (MD) over the S/D feature, forming a first ILD layer over the MG and the MD, and subsequently patterning the first ILD layer to form an opening. The method further includes forming a metal layer in the opening, such that the metal layer contacts both the MG and the MD, removing a top portion of the metal layer to form a trench, filling the trench with a dielectric layer, and subsequently forming a second ILD layer over the dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a semiconductor device that includes a metal gate structure (MG) disposed over a semiconductor layer, gate spacers disposed on sidewalls of the MG, and a source/drain (S/D) feature in the semiconductor layer and adjacent to the MG;
forming an S/D contact (MD) over the S/D feature;
forming a first interlayer dielectric (ILD) layer over the MG and the MD;
patterning the first ILD layer to form an opening;
forming a metal layer in the first ILD layer, such that the metal layer extends to contact both the MG and the MD, the metal layer includes a continuous sidewall including a top portion interfacing the first ILD layer and a bottom portion intersecting with the MG, wherein slope of the top portion is equal to slope of the bottom portion;

removing a top portion of the metal layer to form a trench;
forming a dielectric layer over a remaining portion of the metal layer, thereby filling the trench; and
forming a second ILD layer over the dielectric layer.

2. The method of claim 1, further comprising forming an interconnect feature in the second ILD layer, wherein a portion of the interconnect feature overlaps with a portion of the dielectric layer.

3. The method of claim 2, wherein an entirety of the interconnect feature overlaps with the dielectric layer.

4. The method of claim 1, further comprising forming an interconnect feature in the second ILD layer, wherein the interconnect feature is free of contact with the dielectric layer.

5. The method of claim 1, wherein the dielectric layer is a first dielectric layer, the method further comprising, before forming the first ILD layer:
recessing a portion of the MG;
depositing a second dielectric layer over the recessed MG, wherein the second dielectric layer is self-aligned with the gate spacers;
recessing a portion of the MD; and
depositing a third dielectric layer over the recessed MD, such that the metal layer extends to directly contact the second and the third dielectric layers.

6. The method of claim 1, wherein forming the metal layer includes:
forming a first opening in the first ILD layer to expose a portion of the MG;
forming a second opening in the first ILD layer to expose a portion of the MD, wherein the second opening merges with the first opening to form a third opening;
depositing a metal layer in the third opening, such that a bottom portion of the metal layer contacts the MG and the MD; and
planarizing a top surface of the metal layer.

7. The method of claim 1, wherein removing the top portion of the metal layer is implemented to be self-aligned with sidewalls of the trench.

8. The method of claim 1, further comprising: before the forming of the first ILD layer, forming an etch stop layer.

9. A method, comprising:
forming a transistor that includes a gate structure over a semiconductor layer and a source/drain (S/D) feature adjacent the gate structure, and a gate spacer disposed between the gate structure and the S/D feature;
forming an S/D contact over the S/D features;
recessing the gate structure;
depositing a gate cap layer over the recessed gate structure;
forming a dielectric structure over the gate cap layer and the S/D contact;
performing an etching process to form a first trench in the dielectric structure and the gate gap layer to expose the recessed gate structure and the S/D contact, wherein a top surface of the gate spacer substantially aligns with a bottom surface of the dielectric structure;
forming a metal layer to fill the first trench, wherein the gate cap layer and the metal layer directly contact a top surface of the recessed gate structure;
recessing the metal layer to form a second trench;
forming a first dielectric layer over the recessed metal layer, thereby filling the second trench; and
forming a second dielectric layer over the first dielectric layer.

10. The method of claim 9, further comprising forming an interconnect feature in the second dielectric layer, wherein the interconnect feature overlaps with the first dielectric layer.

11. The method of claim 9, wherein the recessed metal layer straddles the gate spacer,
wherein a sidewall of the recessed metal layer comprises an upper portion over the gate spacer and a lower portion adjacent to the gate spacer, and in a cross-sectional view, a shape of the sidewall is a linear line.

12. The method of claim 9, further comprising, before forming the dielectric structure:
recessing the S/D contact; and
depositing a S/D cap layer over the recessed S/D contact, wherein the S/D cap layer and the gate cap layer differ in composition, and wherein the metal layer is formed to extend through the S/D cap layer.

13. The method of claim 12, wherein the S/D cap layer and the metal layer directly contact a top surface of the recessed S/D contact.

14. The method of claim 9, wherein a portion of the gate structure is disposed directly below the dielectric structure, and
wherein the gate spacer is substantially not etched during the performing of the etching process.

15. The method of claim 10, wherein an entirety of a bottom surface of the interconnect feature is in direct contact with a top surface of the first dielectric layer.

16. A method, comprising:
forming a semiconductor device that includes a metal gate disposed over a semiconductor layer, a gate spacer disposed on a sidewall of the metal gate, and a source/drain (S/D) feature adjacent the gate spacer;
forming an S/D contact over the S/D feature;
recessing the metal gate;
depositing a first dielectric layer over the recessed metal gate, wherein the first dielectric layer is self-aligned with the gate spacer;
recessing a portion of the S/D contact;
depositing a second dielectric layer over the recessed S/D contact;
depositing a first interlayer dielectric (ILD) layer over the recessed metal gate and the recessed S/D contact; and
forming a butted contact, including:
forming a first opening through the first ILD layer and the first and the second dielectric layers, wherein the first opening extends to below a top surface of the gate spacer, thereby exposing the recessed metal gate and the recessed S/D contact;
depositing a metal layer to fill the first opening, thereby electrically connecting the recessed metal gate with the recessed S/D contact;
removing a top portion of the metal layer to form a second opening above the top surface of the gate spacer; and
depositing a third dielectric layer to fill the second opening; and
depositing a second ILD layer over the butted contact.

17. The method of claim 16, further comprising forming an interconnect feature in the second ILD layer, wherein the interconnect feature overlaps with the third dielectric layer.

18. The method of claim 16, further comprising forming an interconnect feature in the second ILD layer, wherein an entirety of the interconnect feature is vertically offset from the third dielectric layer.

19. The method of claim 16, wherein the resulting butted contact extends along both sidewalls of the gate spacer.

20. The method of claim 16, wherein removing the top portion of the metal layer is implemented to be self-aligned with sidewalls of the second opening.

\* \* \* \* \*